United States Patent [19]

Kinoshita

[11] Patent Number: 5,113,230
[45] Date of Patent: May 12, 1992

[54] SEMICONDUCTOR DEVICE HAVING A CONDUCTIVE LAYER FOR PREVENTING INSULATION LAYER DESTRUCTION

[75] Inventor: Hiroyuki Kinoshita, Tokyo, Japan

[73] Assignee: Tokyo Shibaura Denki Kabushi Kaisha, Kawasaki, Japan

[21] Appl. No.: 565,215

[22] Filed: Aug. 8, 1990

Related U.S. Application Data

[63] Continuation of Ser. No. 251,979, Sep. 28, 1988, abandoned, which is a continuation of Ser. No. 468,208, Feb. 22, 1983, abandoned.

[30] Foreign Application Priority Data

Feb. 22, 1982 [JP] Japan .................................. 57-27023
Apr. 20, 1982 [JP] Japan .................................. 57-64684

[51] Int. Cl.$^5$ ...................... H01L 27/01; H01L 29/78; H01L 27/02; H01L 29/40
[52] U.S. Cl. ..................................... 357/51; 357/23.1; 357/23.12; 357/23.13; 357/53; 357/71
[58] Field of Search ................. 357/23.1, 23.12, 23.13, 357/51, 53, 71

[56] References Cited

U.S. PATENT DOCUMENTS

| | | | |
|---|---|---|---|
| 3,518,506 | 6/1970 | Gates .................................... | 357/53 |
| 3,862,017 | 6/1975 | Tsunemtsu et al. .................. | 357/51 |
| 4,074,300 | 2/1978 | Sakai et al. ............................ | 357/71 |
| 4,288,806 | 9/1981 | Ronen .................................... | 357/51 |
| 4,423,433 | 12/1983 | Imaizumi et al. ..................... | 357/53 |
| 4,424,579 | 1/1982 | Roesner ................................. | 357/41 |
| 4,443,812 | 4/1984 | Imaizumi et al. ..................... | 357/51 |

FOREIGN PATENT DOCUMENTS

| | | | |
|---|---|---|---|
| 52-75987 | 6/1977 | Japan ............................. | 357/23.13 |
| 54-137286 | 10/1979 | Japan . | |
| 56-51874 | 5/1981 | Japan ............................. | 357/23.13 |
| 57-24563 | 2/1982 | Japan ..................................... | 357/51 |
| 2077493 | 12/1981 | United Kingdom ............... | 357/23.8 |

OTHER PUBLICATIONS

R. Allen, "Thin-film deoids on silicon chip with stand up to 500° C.", *Electronics*, vol. 50, (Jan. 1980), pp. 39-40.

T. Okabe et al., "MOS FET's for Power Amplifier Use", *Electronics and Communications in Japan*, vol. 63-C (1980), pp. 113-121.

M. J. Walker, "A Compatible Technique for the Formation of Thin Tantalum Film Resistors on Silicon Integrated Circuits", *IEEE Transactions on Electron Devices*, vol. ED-13 (May 1966) pp 472-476.

Japanese Patent Publication (KOKOKU) No. 43-455 H. Egawa.

Japanese Patent Publication (KOKOKU) No. 45-34641, S. Kubo et al., Nov. 6, 1970.

Japanese Patent Publication (KOKOKU) No. 52-33471, S. Kubo et al., Aug. 29, 1977.

*Primary Examiner*—J. Carroll
*Attorney, Agent, or Firm*—Finnegan, Henderson, Farabow, Garrett and Dunner

[57] ABSTRACT

On a semiconductor substrate between the source region and drain region, there is provided a gate electrode, through an insulation layer. There is further provided a conductive layer partially allowed to electrically contact this gate electrode and covering the region above the side edge portions of the gate electrode so as to mitigate the intensity of an electric field at those side edge portions.

7 Claims, 6 Drawing Sheets

SEMICONDUCTOR DEVICE HAVING A CONDUCTIVE LAYER FOR PREVENTING INSULATION LAYER DESTRUCTION

This application is a continuation of Ser. No. 07/251,979 filed on Sep. 28, 1988, abandoned, which is a continuation of Ser. No. 06/468,208 filed on Feb. 22, 1983, now abandoned.

BACKGROUND OF THE INVENTION

This invention relates to a semiconductor device provided with a means for preventing the breakdown of an insulation layer.

In an MOS (Metal Oxide Semiconductor) device, for example, in which a gate electrode is provided, through an insulation layer, onto a silicon substrate portion between a source region and drain region and in which the potential of a silicon substrate portion beneath the insulation layer is controlled through said gate electrode, the input impedance is extremely high and the thickness of the insulation layer (for example, oxide layer) is very thin such as 400 to 1000 Å and the insulation withstand voltage thereof is as low as 20 to 100 V. For this reason, when static electricity of a relatively high potential, for example, due to friction or the like, is applied to an input terminal of the gate electrode of the MOS device, the oxide layer (gate oxide layer) is easily broken down. Accordingly, a protective circuit, including a semiconductor element for clamping a high voltage from the input terminal to a specified value by the forward characteristic of the pn junction or the breakdown characteristic of the pn junction, so as to prevent the breakdown of the gate oxide layer of the MOS device to be protected, is necessarily connected to the input terminal of the gate electrode of the MOS device.

An example of this protective circuit is explained below with reference to FIG. 1. In FIG. 1, numeral 1 denotes an MOS transistor which is to be protected and numeral 2 denotes a signal input terminal to a gate electrode of that MOS transistor 1. Between the gate electrode of the MOS transistor 1 and the signal input terminal 2, there is connected a protective circuit 3. The protective circuit 3 includes a resistor R connected between the signal input terminal 2 and the gate electrode of the MOS transistor to be protected, and an MOS transistor 4 whose source-drain path is connected between the output end of this resistor R and a voltage source Vss (which is usually set at a level of 0 V) and in which the gate electrode and source are connected. Since the gate electrode of the MOS transistor 4 is connected to the voltage source Vss, it is possible to increase the protection of the gate oxide layer of the MOS transistor 1 (for example, an input MOS transistor of the MOS integrated circuit) by utilizing the fact that the breakdown voltage of the pn junction of the MOS transistor 4 on the drain side decreases in level. In the above-mentioned protective circuit 3, the high voltage applied to the signal input terminal 2, at the time of passing through the resistor R, varies from its sharp waveform to a relatively gentle waveform, and this voltage of gentle waveform is inputted to the pn junction of the MOS transistor 4 and is thus clamped to a specified voltage. Accordingly, the MOS transistor 1 is protected from being broken down.

FIG. 2 shows a plan pattern of the protective circuit 3 shown in FIG. 1. In FIG. 2, an aluminium wire 6 is led out from a bonding pad 5, and is connected at one end to a first end 8 of the resistor R through a contact hole 7. This resistor R is formed of a diffusion layer or polycrystalline silicon layer and, after it is wired over a relatively large length, is connected to a drain diffusion layer 4a of the MOS transistor 4, and is also connected to a gate electrode 11 of the MOS transistor 1 through contact holes 9 and 10. Note here that a drain diffusion layer of the MOS transistor 1 is designated by the reference numeral 1a, while a source diffusion layer thereof is designated by the reference numeral 1b. In addition, a drain diffusion layer of the MOS transistor 4 is designated by the reference numeral 4a, a source diffusion layer thereof by the reference numeral 4b and a gate electrode thereof by the reference numeral 12. The power source Vss has its line 13 connected to the source diffusion layer 4b through a contact hole 14 and connected to the gate electrode 12 through a contact hole 15. The resistor R usually has a resistance value of 500 to several kilo-ohms and a time constant of 1 to 5 nS. That is, this time constant causes a decrease in level of the peak voltage of a pulse having a sharp rise applied to the first end 8 of the resistor R and is so adjusted as to permit a forward or backward response at the diffusion layer of the MOS transistor 4.

Conventionally, the protection of the gate oxide layer of the MOS transistor 1 was effected solely by the use of the above-mentioned protective circuit 3. With the progress of the techniques concerned, however, the gate oxide layer of the MOS transistor 1 has become thinner than in the prior art. This makes it very difficult to design the protective circuit 3 accordingly. Because the use of the protective circuit 3 alone is insufficient to protect the thin gate oxide layer of the MOS transistor 1, the breakdown of the MOS transistor 1 occurs very often.

In an effort to prevent the breakdown of the MOS transistor 1, the inventor of the present application has made various investigations into the causes of this type of breakdown and, as a result, has found that the breakdown occurs at specific portions of the insulation layer. Reference will now be made to the said result of these investigations by the use of FIGS. 3 and 4. As shown in FIG. 3, the regions where the breakdown of the gate insulation layer occurs are the side edge portions 11a and 11b (the portions having small radii of curvature and being represented by dotted lines a and b) of the gate electrode (polycrystalline silicon) 11. The side edge portions are located in the directions of the source and drain regions, and it has been confirmed that breakdown does not occur at a central portion 11c of the gate electrode 11. To explain in more in detail by the use of a sectional view shown in FIG. 4, the portion of the insulation layer 16 which is located beneath the central portion 11c has a uniform distribution of electric lines of force 17 and is therefore kept from breaking down. However, the electric lines of force from the side edge portion 11a are concentrated, as shown in FIG. 4, since the radius of curvature thereof is small. Accordingly, the portion of the insulation layer beneath this side edge portion 11a receives an extremely high electric field and it has thus been proved that this insulation layer portion is broken down owing to discharge attributable to the application of this electric field. For the purpose of decreasing the degree of concentration of the electric lines of force at the side edge portion 11a, it is contemplated to form the polycrystalline silicon gate electrode 11 by patterning based on the use of etching techniques, and thereafter to perform what is called "after oxidation" directed to oxidizing the surface of the electrode 11, thereby enlarging both the radius of curvature of the side edge portion 11a and the thickness of the gate oxide layer including this side edge portion. However, it is not possible to make the radius of curvature of the side edge portion 11a larger than the thickness of the gate electrode. When the "after oxidation" step is excessively performed, the thickness of the gate electrode 11 is decreased and this will decrease the radius of curvature of the side edge portion 11a. This undesirably affects the width of the gate electrode and the depth of the diffusion layer. This means that a limitation is imposed upon the degree of the "after oxidation" which is possible. It is therefore impossible to greatly increase the insulation withstand voltage of the MOS transistor 1.

On the other hand, the protective circuit shown in FIG. 2 is in some cases so constructed as to have a plan pattern as shown in FIG. 9. The protective circuit shown in FIG. 9 is different from that shown in FIG. 2 in that a second terminal of the resistor R and diffusion layer 4a of the MOS transistor 4 is connected by means of an aluminium lead 19 through contact holes 9 and 18. In FIG. 9, the same parts are denoted by the same reference notations as in FIG. 2.

Referring to FIG. 9, as previously mentioned in connection with FIG. 2, the resistor R has a resistance value of, for example, 500 to several kilo-ohms and a time constant of, for example, 1 to 5 nS. Note here that an insulation layer is interposed, though not shown, between this resistor R and the semiconductor substrate.

Consider the case where this resistor R is formed of a diffusion layer. In this case, upon application of a high voltage to the bonding pad 5, this high voltage is applied to the first end 8 of the resistor R through the aluminium lead 6 and contact hole 7. This gives rise to a breakdown at the first end 8 to cause a local current to pass through the same. In a CMOS (Complementary MOS transistor, not shown) a latch-up phenomenon (this indicates the phenomenon wherein a large current flows due to input noises and the like) is liable to occur. Therefore, it is preferable to use polycrystalline silicon as the material of the resistor R. Even in this case, however, the protective circuit for the transistor to be protected is broken down according to a circuit condition. Preventing the dielectric breakdown of the protective circuit of the transistor to be protected (for example, the transistor 1 of FIG. 1) has the same significance as directly preventing the dielectric breakdown of the transistor to be protected. With this in mind, the inventor of this application has made investigations of the dielectric breakdown of the resistor R, the results being explained with reference to FIGS. 9 to 11.

That is, the electric lines of force are concentrated to a remarkable extent in the regions beneath the side edge portions 20a and 20b of the resistor R of FIG. 10, with the result that the insulation layer falling under these regions is broken down. On the other hand, the region located beneath the central portion 20c of the resistor R has a uniform electric-line-of-force distribution, with the result that the insulation layer falling under this region is freed from breakdown. FIG. 11 shows a distribution of electric lines of force in a sectional area taken along the line XI—XI of FIG. 10. It is seen from FIG. 11 that the electric lines of force are remarkably concentrated particularly in the side edge portion 20a.

It has thus been concluded from the said results of investigation that it will be possible to prevent the breakdown of the gate insulation layer of the MOS transistor 1 to be protected by decreasing the degree of concentration of electric lines of force at the side edge portions of the gate electrode 11. It has also been concluded that the breakdown of the insulation layer portion beneath the resistor R of the protective circuit can be prevented by decreasing the degree of concentration of electric lines of force at the side edge portions of the resistor R.

SUMMARY OF THE INVENTION

The object of the invention is to provide a semiconductor device which is provided with a means for preventing the concentration of electric lines of force at the side edge portions of a conductive layer provided within a semiconductor substrate.

A semiconductor device according to this invention comprises a first conductor disposed within an insulation layer of the semiconductor device and a second conductor or conductive layer which is held at the same potential as the first conductor and arranged over the first conductor so as to mitigate the intensity of an electric field at the side edge portions of the first conductor.

According to a first aspect of the invention, there is provided a semiconductor device having a gate electrode provided, through an insulation layer, on a portion of a semiconductor substrate located between a source region and a drain region, and a conductive layer means which is held at the same potential as the gate electrode and which covers the regions above the side edge portions of the gate electrode located, at least, in the directions of the source region and drain region, so as to mitigate the intensity of an electric field at the side edge portions.

According to a second aspect of the invention, there is provided a semiconductor device including a resistive layer having a first end for receiving an input signal from outside and a second end connected to a semiconductor element, the resistive layer being provided within an insulation layer on a semiconductor substrate, and a conductive layer which is held at the same potential as the resistive layer and which covers the regions above the side edge portions of at least the first end of the resistive layer, so as to mitigate the intensity of an electric field at the side edge portions.

DETAILED DESCRIPTION OF THE PREFERRED EMBODIMENTS

Figure 1:
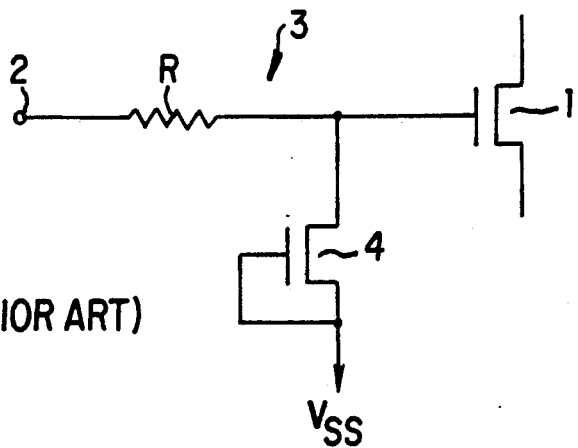
FIG. 1 is a circuit diagram including an MOS transistor to be protected and a protective circuit for protecting this MOS transistor.
Figure 2:
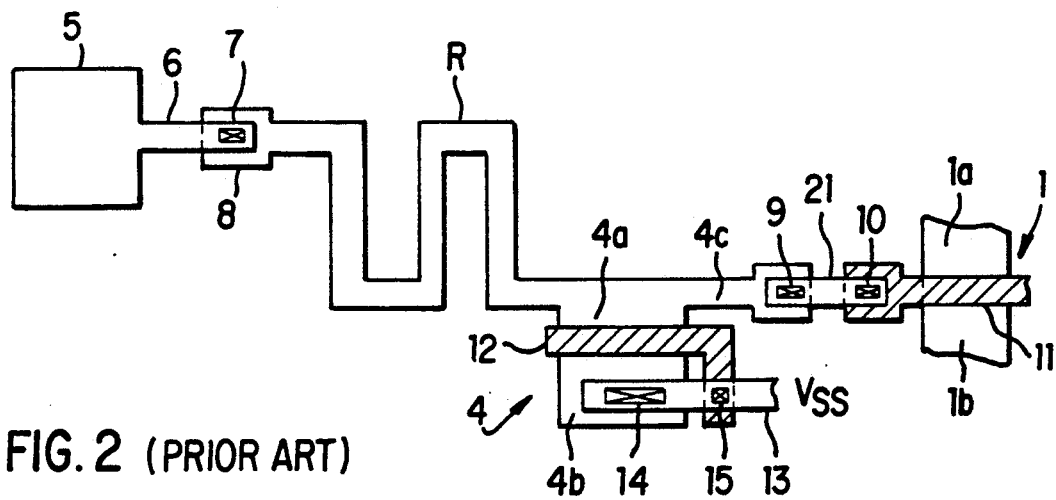
FIG. 2 is a view showing a plan pattern of the protective circuit shown in FIG. 1.
Figure 3:
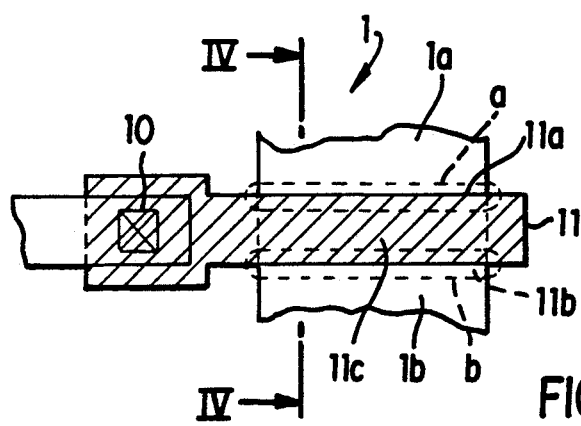
FIG. 3 is a view showing an enlarged plan pattern of the MOS transistor to be protected shown in FIG. 1.
Figure 4:
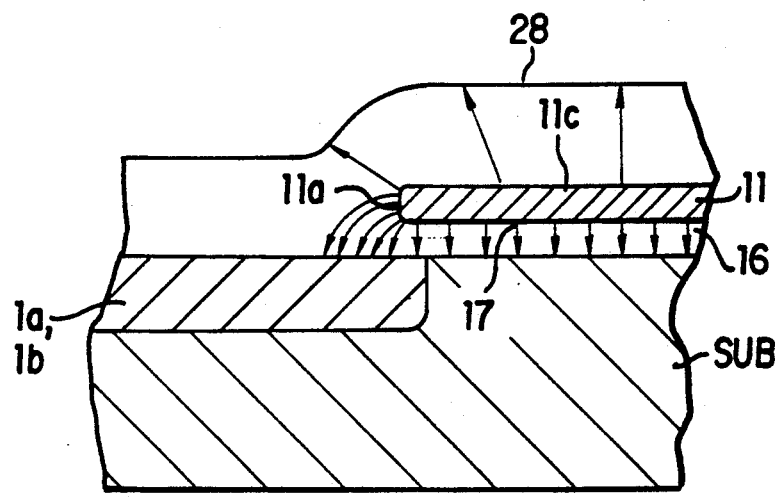
FIG. 4 is an enlarged sectional view showing the relationship between a section taken along the line IV—IV of FIG. 3 and the electric lines of force.
Figure 5:
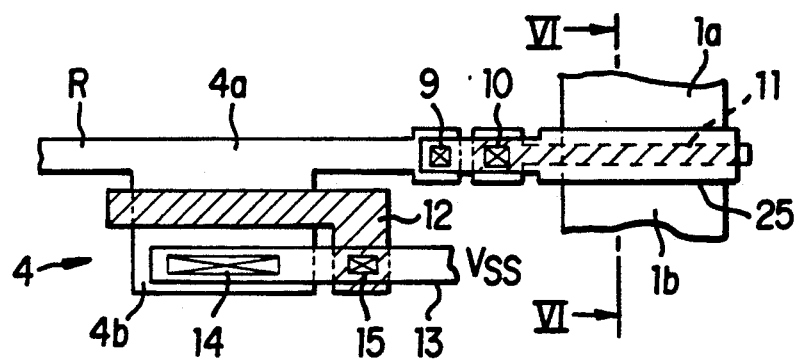
FIG. 5 is a view showing a plan pattern of a first embodiment of the invention.
Figure 6:
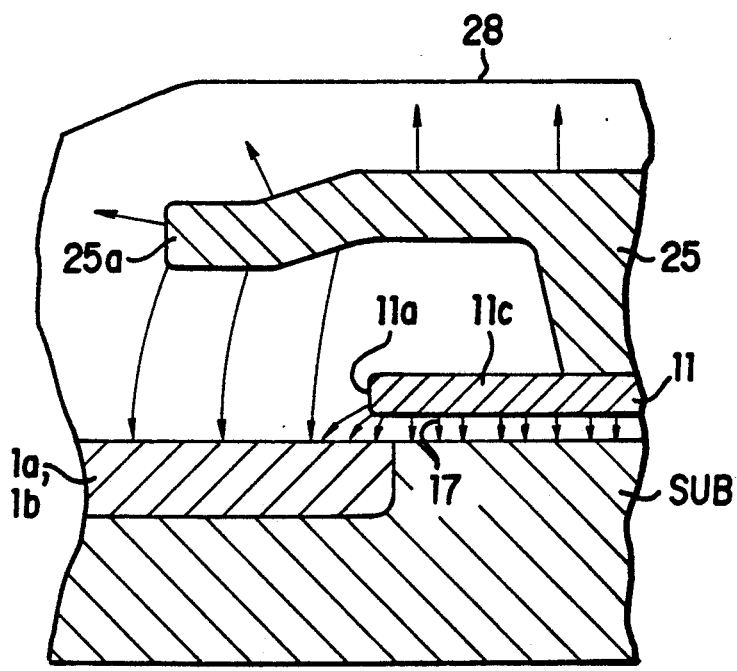
FIG. 6 is an enlarged sectional view taken along the line VI—VI of FIG. 5.

Description will now be given of a first embodiment of the invention with reference to FIGS. 5 and 6. In the prior art, as shown in FIGS. 2 and 3, a diffusion region 4c constituting an extended portion of the drain diffusion region 4a of the MOS transistor 4 is connected, by means of the aluminium lead 21, to the gate electrode 11 of the MOS transistor 1 to be protected through the contact holes 9 and 10. In the present invention, however, as shown in FIG. 5, an aluminum conductive layer 25 is provided so as to cover the upper surface of the gate electrode 11. As shown in FIG. 6, this aluminium conductive layer 25 is held at the same potential as the gate electrode 11 by having part of it contact the gate electrode 11, and its side edge portion 25a is extended beyond a side edge portion 11a of the gate electrode 11. For this reason, the concentration of electric lines of force at the side edge portion 11a of the gate electrode 11 is mitigated. Accordingly, the gate insulation layer is not broken down at the area falling beneath this side edge portion 11a. Although there is a likelihood that a concentrated electric field is produced at the side portion 25a of the aluminum conductive layer 25, still, the portion of the insulation layer beneath the side edge portion 25a is not broken down because the thickness of the insulation layer between the side edge portion 25a and the substrate is greater than the thickness of the gate oxide layer.

Figure 7:
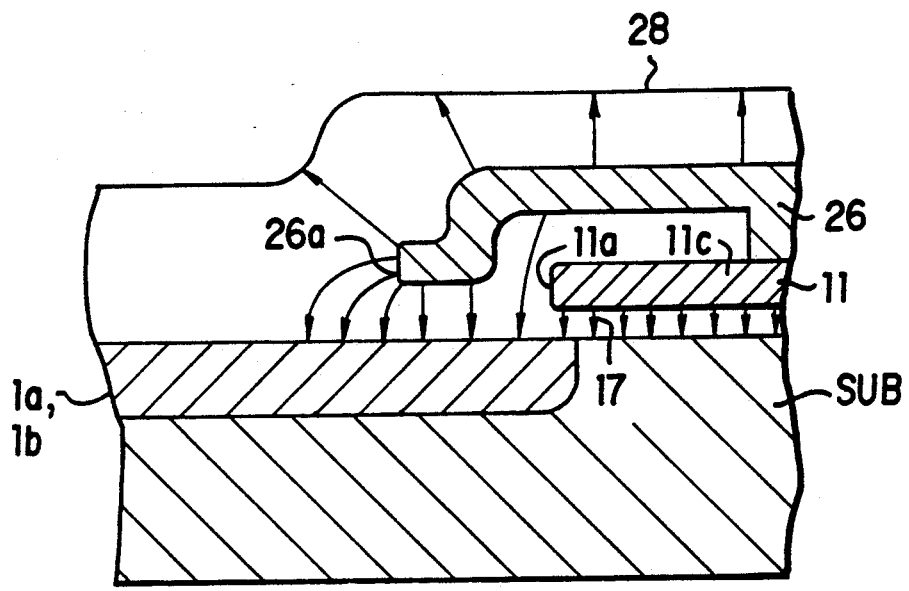
FIG. 7 is a sectional view of a second embodiment of the invention.

In a second embodiment shown in FIG. 7, a polycrystalline silicon layer 26 allowed to contact the gate electrode 11 is used as the conductive layer for covering the gate electrode 11. Also in this case, it is possible to mitigate the concentration of electric lines of force 17 at the side edge portion 11a of the gate electrode since the insulation layer beneath the silicon layer 26 is made thinner than that beneath the aluminium conductive layer shown in FIG. 6. However, it is possible that the electric lines of force are concentrated at the side edge portion 26a of the conductive layer 26 to cause the breakdown of the insulation layer portion falling below the side edge portion 26a.

Figure 8:
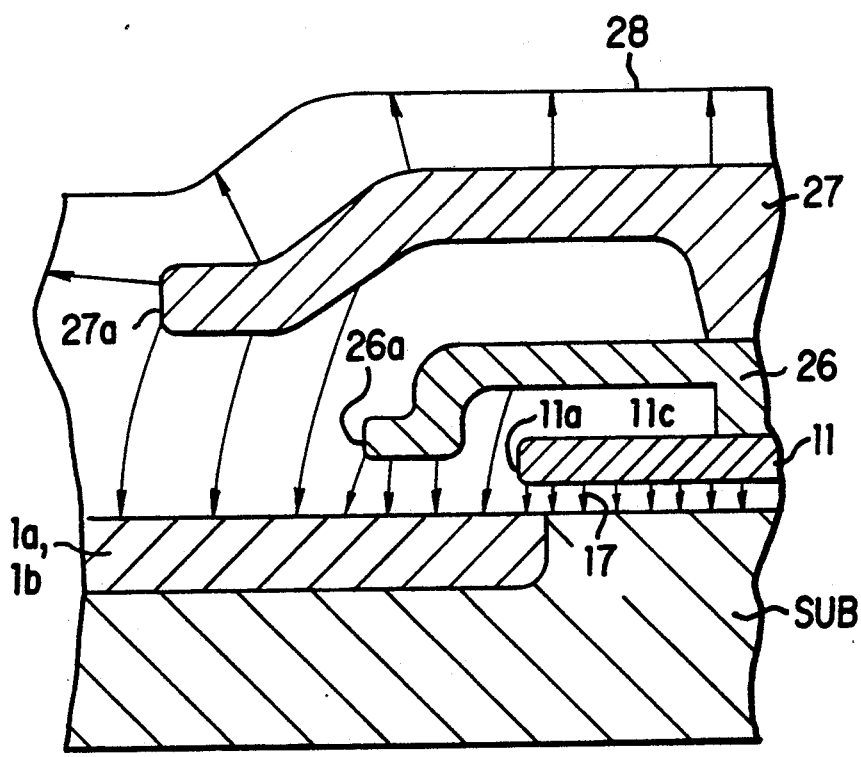
FIG. 8 is a sectional view of a third embodiment of the invention.

In a third embodiment of the invention shown in FIG. 8, the region above the gate electrode 11 is covered by the polycrystalline silicon layer 26 having the same potential as the gate electrode 11, said layer 26 being further covered by an aluminium conductive layer 27 having the same potential as the layer 26. A side edge portion 27a of this aluminium conductive layer 27 is extended beyond the side edge portion 26a of the layer 26. According to this third embodiment, it is possible to largely mitigate the concentration of electric lines of force at the side edge portion 11a of the gate electrode 11 and at the side edge portion 26a of the conductive layer 26.

It is to be noted here that in the sectional views of FIGS. 4, 6, 7 and 8 the insulation layer exists in the interspace between the line 28 and the substrate, but an illustration thereof is omitted for the sake of simplicity. The gate electrode 11 is not limited to a one formed of polycrystalline silicon alone but may be formed of Mo, Mo-silicon or W. In addition, the provision of the conductive layers 25, 26 and 27 does not necessitate the modification of steps for the process of manufacturing the semiconductor device, nor the addition of steps for this process, nor the enlargement of chip size.

Figure 9:
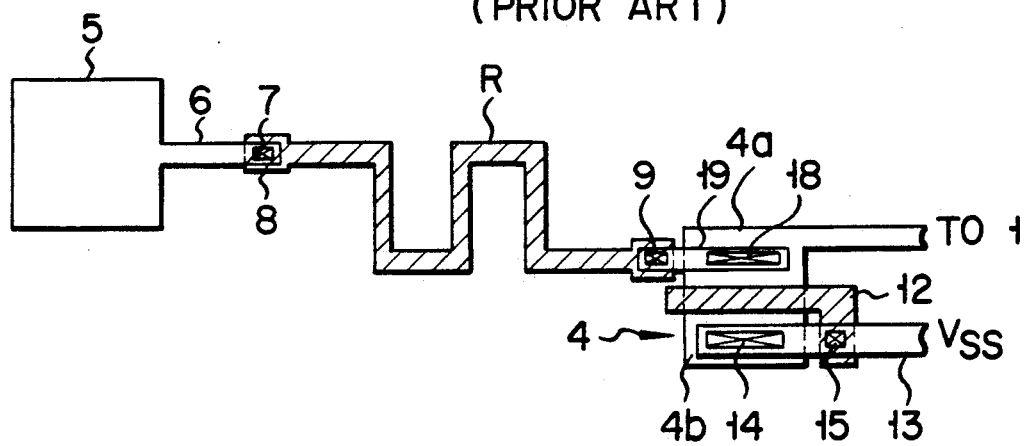
FIG. 9 is a view showing a modification of a part of the plan pattern shown in FIG. 2.
Figure 10:
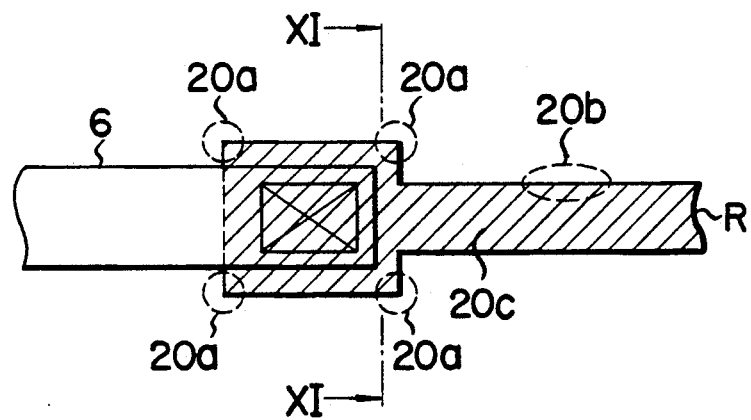
FIG. 10 is a view showing an enlarged plan pattern of a first end of the resistor shown in FIG. 9.
Figure 11:
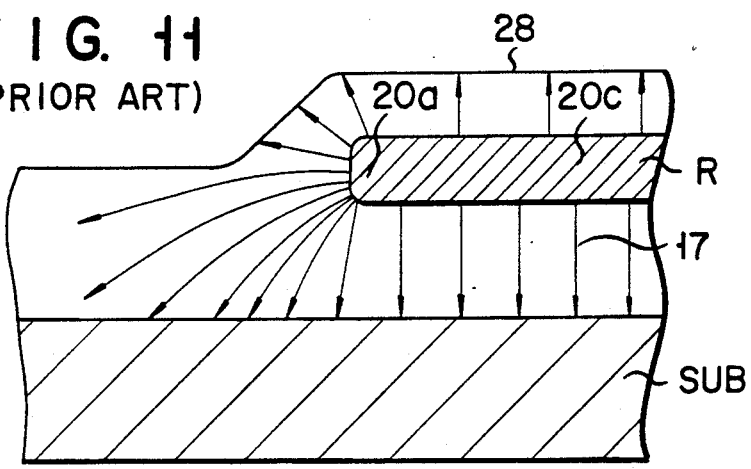
FIG. 11 is an enlarged sectional view showing the relationship between a section taken along the line XI—XI of FIG. 10 and the electric lines of force.
Figure 12:
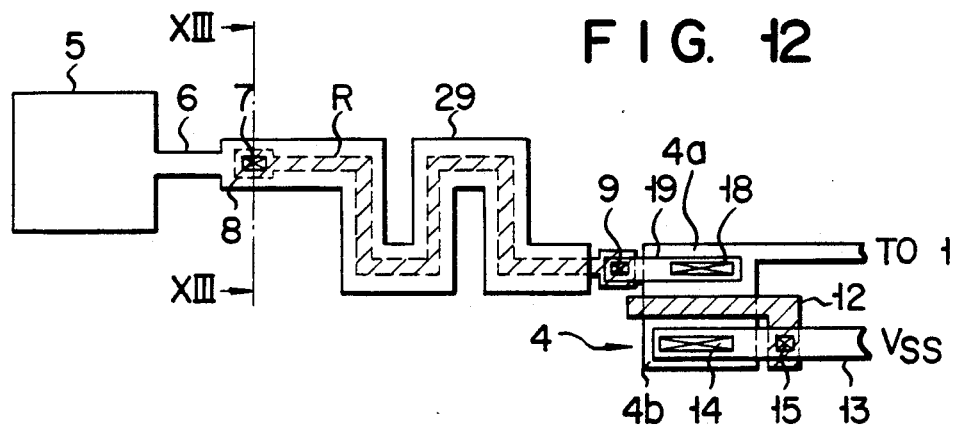
FIG. 12 is a view showing a plan pattern of a fourth embodiment of the invention.
Figure 13:
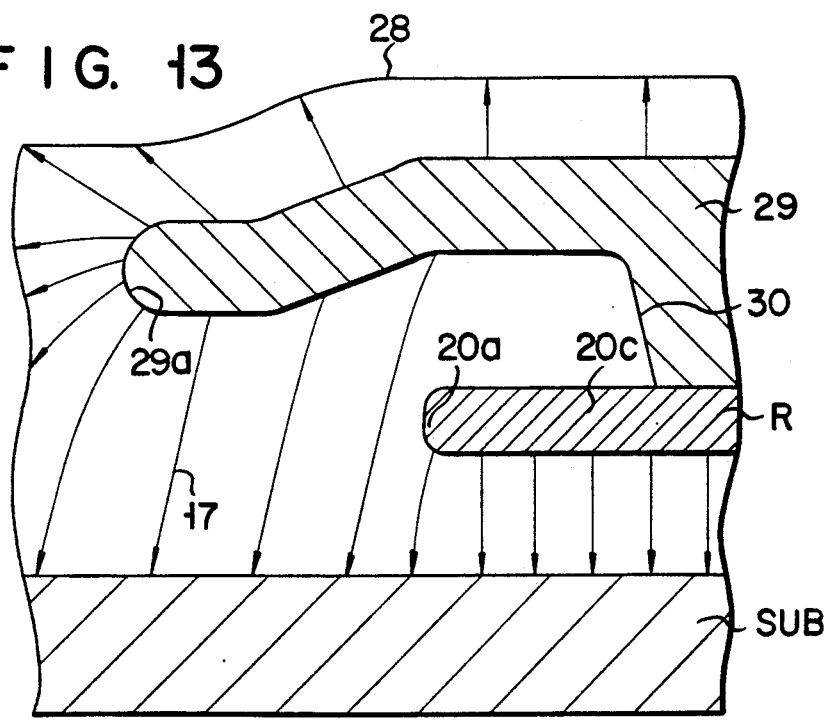
FIG. 13 is an enlarged sectional view taken along the line XIII—XIII of FIG. 12.

Reference will now be made to a fourth embodiment of the invention with the use of FIGS. 12 and 13. In FIG. 12, the resistor R formed of polycrystalline silicon is provided within the insulation layer on the substrate and has its one end 8 connected to the aluminium lead wire 6 extended from the bonding pad 5 through the contact hole 7. The second end of this resistor R is connected to the drain diffusion layer 4a of the MOS transistor 4 through contact holes 9, 18 and the aluminum wire 19. The relationship between each of the portions of the MOS transistor 4 will not be described here in detail since it was explained above in connection with FIG. 9. Substantially all of the upper surface of the resistor R, including its first end 8, is covered by the aluminium conductive layer 29. As shown in FIG. 13 ( a sectional view taken along the line XIII—XIII of FIG. 12), the aluminium conductive layer 29 is held at the same potential as the resistor R by being brought into electric contact with the resistor R through a contact hole 30, and is connected to the aluminium wire 6. A side edge portion 29a of the aluminium conductive layer 29 is extended beyond the side edge portion 20a of the resistor R. FIG. 13 indicates that the concentration of electric lines of force at the side edge portion 20a of the resistor R is largely mitigated (See FIG. 11). FIG. 13 also indicates that the electric lines of force 17 are concentrated, to some extent, at the side edge portion 29a of the conductive layer 29. Since, however, the thickness of the insulation layer between this side edge portion 29a and the substrate SUB is, for example, twice or three times as large as the thickness of the insulation layer between the side edge portion 20a of the resistor R and the substrate SUB, the insulation layer located beneath the side edge portion 29a is not broken down. The inventor of the present invention performed breakdown tests with respect to the protective circuits shown in FIG. 9 and FIG. 12. As a result, the protective circuit shown in FIG. 9 was broken down by the application of a voltage of 200 V while the protective circuit shown in FIG. 12 withstood an applied potential of more than 350 V.

Figure 14:
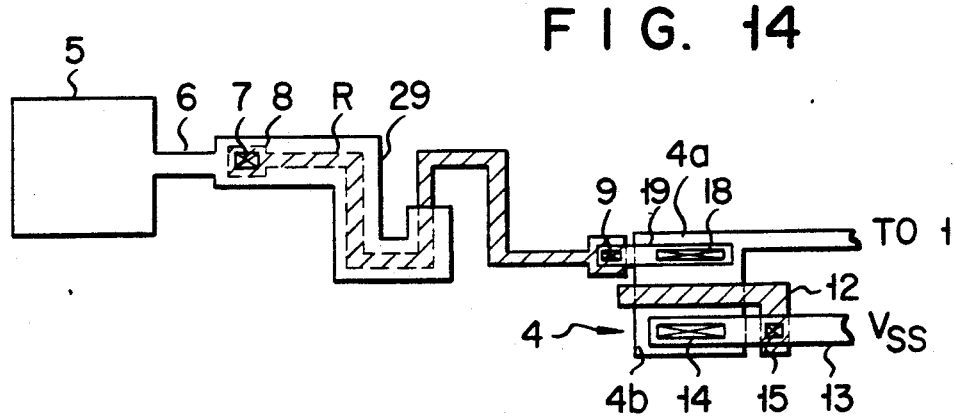
FIG. 14 is a view showing a plan pattern of a fifth embodiment of the invention.

As shown in FIG. 14 directed to a fifth embodiment of the invention, this invention can be reduced so that the aluminum conductive layer 29 may cover the upper surface of the first end 8 of the resistor R and a part of the resistor R directly behind this first end. In a sixth embodiment shown in FIG. 15, only the first end 8 of the resistor R is covered by the aluminium conductive layer 29. The protective circuits according to the embodiments shown in FIGS. 14 and 15 have a slightly smaller protecting ability than the protective circuit according to the fourth embodiment shown in FIG. 12. However, they still produce the effect of the present invention. This is because it is the first end 8 of the resistor R near the contact hole 7 closest to the bonding pad 5 that receives a high voltage having a sharp peak value. In more detail, in the portion of the resistor R extending from this first end 8 to the contact hole 9, an excessive voltage waveform is allowed to decrease by degrees by the function of the resistor R. And when the pn junction of the MOS transistor 4 is forwardly rendered conductive, or when this pn junction is rendered conductive due to breakdown, the excessive voltage value is allowed to decrease by degrees, from the first terminal 8, due to the voltage drop in the resistor R. Thus, the structures shown in FIGS. 14 and 15 also produce the effect of the present invention.

Figure 15:
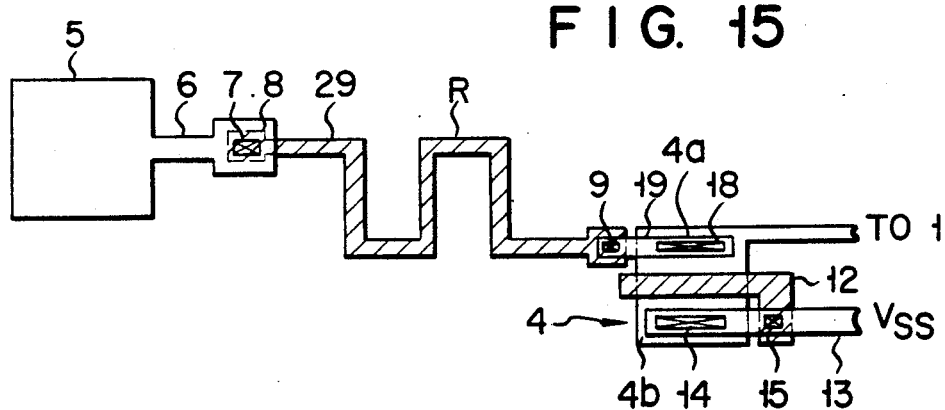
FIG. 15 is a view showing a plan pattern of sixth embodiment of the invention; and, FIG. 16 is a view showing a plan pattern of a seventh embodiment of the invention.
Figure 16:
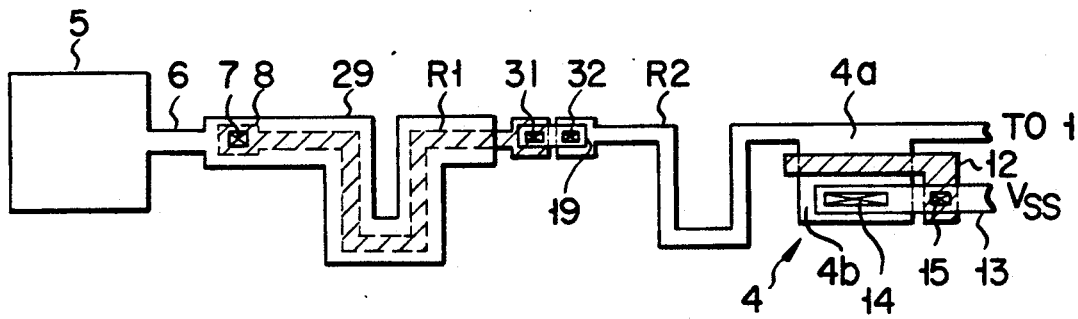

In a seventh embodiment, shown in FIG. 16, a polycrystalline silicon resistor $R_1$ having a relatively low resistance is connected between the contact holes 7 and 31, contact holes 31 and 32 are connected by means of the aluminium wire 19, and the contact hole 32 and the drain diffusion layer 4a of the MOS transistor 4 are connected by a resistor $R_2$ constituted by a diffusion layer. In this embodiment, the whole upper surface of the polycrystalline silicon resistor $R_1$ is covered by the aluminium conductive layer 29. Also in the structure of FIG. 16, however, the resistor $R_1$ may be covered by the aluminium conductive layer 29, the first end 8 and the part of the resistor $R_1$ directly behind the first end 8 may be covered by the aluminium conductive layer 29, as shown in FIG. 14, or only the first end of the resistor $R_1$ may be covered by the aluminium conductive layer 29, as shown in FIG. 15. The resistors R of FIGS. 12, 14 and 15 and the resistor $R_1$ of FIG. 16 have been described as being formed of polycrystalline silicon. Instead of these resistors, however, a resistor formed of $MoSi_2$, Mo, or W may be provided within the insulation layer. Further, the kind of semiconductor device which can be protected in the above-mentioned way is not limited to MOS integrated circuits, but may be bipolar integrated circuits, or an MOS transistor as a single unit. The above-mentioned embodiments of FIGS. 12 to 16 can be reduced without modifying the process steps for manufacturing the body of a semiconductor device, adding a process step or steps to such process steps, or enlarging the chip size.

What is claimed is:

1. A semiconductor device having an insulation layer and a conductive layer for preventing breakdown of the insulation layer comprising:
   a semiconductor substrate;
   a resistor formed over said semiconductor substrate having a first end for receiving an input signal from an input terminal and having corners and side edges, said resistor disposed within said insulation layer and said insulation layer interposed between said semiconductor substrate and said first end of said resistor so that said first end of said resistor is insulated from said substrate; and
   a conductor disposed within said insulating layer and connected to said first end of said resistor through a contact hole arranged such that it covers in an overhang fashion at least the corners of the first end portion of said resistor and the entire length of the side edges so as to mitigate the intensity of an electric field at said corners and side edges.

2. The semiconductor device according to claim 1, wherein said conductor is formed of an aluminum layer.

3. The semiconductor device according to claim 1, wherein said resistor is formed of a polycrystalline silicon layer.

4. A semiconductor device having an input terminal and a conductive layer for preventing an insulation layer breakdown comprising:
   a MOS transistor which includes a source region, a drain region, and a gate insulation layer provided on a semiconductor substrate portion between said source and drain regions, and a gate electrode having side edge portions provided on said gate insulation layer, said gate electrode being connected to said input terminal for supplying an input signal from said input terminal to said gate electrode; and
   a conductor disposed within said insulation layer and connected to said gate electrode and which covers in an overhang fashion said gate electrode and covers said source and drain regions, so as to mitigate the intensity of an electric field generated between the edge of the gate electrode and the drain and source regions;
   wherein said conductor includes a first conductive layer with side edge portions and a second conductive layer, said first conductive layer contacting said gate electrode and covering the regions above the side edge portions of said gate electrode with side edge portions located, at least, above said source region and said drain region, so as to mitigate the intensity of an electric field at said side edge portions; and wherein said second conductive layer contacts said first conductive layer and covers the regions above the side edge portions of said first conductive layer, so as to mitigate the intensity of an electric field at said side edge portions of said first conductive layer.

5. The semiconductor device according to claim 4, wherein said first conductive layer is formed of a polycrystalline silicon layer.

6. The semiconductor device according to claim 4, wherein said second conductive layer is formed of an aluminum layer.

7. The semiconductor device according to claim 4 wherein said gate electrode spans the substrate between said source and drain regions.

* * * * *